United States Patent [19]

Haining et al.

[11] 3,778,900

[45] Dec. 18, 1973

[54] METHOD FOR FORMING INTERCONNECTIONS BETWEEN CIRCUIT LAYERS OF A MULTI-LAYER PACKAGE

[75] Inventors: Frank W. Haining, Binghamton; Loren J. Puterbaugh, Endwell, both of N.Y.

[73] Assignee: International Business Machines Corporation, Armonk, N.Y.

[22] Filed: Sept. 4, 1970

[21] Appl. No.: 69,646

[52] U.S. Cl. ........................... 29/628, 156/3, 156/16
[51] Int. Cl. ........................... H01r 43/00, C23f 1/02
[58] Field of Search ..................... 156/3, 8, 16, 155, 156/272; 117/93, 31; 204/159.11, 159.14, 159.2; 96/35.1, 36.2

[56] References Cited

UNITED STATES PATENTS

| | | | |
|---|---|---|---|
| 3,311,966 | 4/1967 | Shaheen et al. | 156/3 X |
| 3,369,293 | 2/1968 | Tillotson | 156/3 X |
| 3,476,561 | 11/1969 | Bertelsen et al. | 156/11 X |
| 3,264,402 | 8/1966 | Shaheen et al. | 174/68.5 |
| 3,319,317 | 5/1967 | Roche et al. | 29/155.5 |
| 3,060,076 | 10/1962 | Robinson | 156/252 |
| 3,271,180 | 9/1966 | White | 117/38 |

OTHER PUBLICATIONS

Reed, L. J. "Etching of Epoxy Glass Circuit Board," IBM Technical Disclosure Bulletin Vol. 6, No. 8, January 1964.

Rodite, R. R. "Altering Circuit Connections" IBM Technical Disclosure Bulletin Vol. 11, No. 8, January 1969, page 896.

Kahan, G. J. "Heat Insulation Coating for a Compound Mask", IBM Technical Disclosure Bulletin Vol. 5, No. 11, April 1963.

IBM Technical Disclosure Bulletin, Vol. 5, No. 8, Jan. 1963.

*Primary Examiner*—George F. Lesmes
*Assistant Examiner*—Lorraine T. Kendell
*Attorney*—Hanifin and Jancin and K. P. Johnson

[57] ABSTRACT

Process for forming holes in an insulation layer for interconnecting conductors between conductive layers of a multi-layer circuit board in which photosensitive dielectric is placed between conductive foils to form a multi-layer assembly. The dielectric may be either the negative or positive type and is selectively exposed to radiant energy to produce soluble and insoluble portions. If negative, exposure occurs prior to adding both foils; if positive, exposure is after both foils are in place. Holes are formed in one or both foils corresponding to the location of the soluble portions of the dielectric or to the portions to be solubilized by exposure. Development then removes the soluble dielectric resulting in well formed holes for conductors.

5 Claims, 16 Drawing Figures

INVENTORS
FRANK W. HAINING
LOREN J. PUTERBAUGH
BY K. P. Johnson
ATTORNEY

METHOD FOR FORMING INTERCONNECTIONS BETWEEN CIRCUIT LAYERS OF A MULTI-LAYER PACKAGE

BACKGROUND OF THE INVENTION

The construction of conductors to interconnect parallel circuit layers has long been accomplished by drilling holes through the layer of dielectric separating two circuit layers and then depositing a conductive metal in the hole. As the miniaturization of electronic cir-cuits continues, conductor sizes become smaller and a reduction in hole size for the interconnecting or via conductors is required. Interconnecting conductors or vias are used to electrically connect circuit lines lying in different, generally parallel, planes of circuitry in a multi-layer structure. Of various methods for forming holes, dielectric etching has been found to offer the advantages of low cost and high production capability. In this process, holes are formed in the outer metal foil to expose the dielectric to the etchant through the metal.

It has the drawback, however, of dissolving the dielectric irregularly and omnidirectionally thus producing generally spherical holes in the insulation separating the conductive layers. Therefore an etched hole generally has the same diameter as length, requiring that adjacent via holes be separated sufficiently to overcome possible short-circuiting. This characteristic has been one of the limitations preventing greater circuit density. The irregular shape of the holes also causes variations in circuit impedance after the hole is filled with a conductor.

SUMMARY OF THE INVENTION

Accordingly, it is a primary object of this invention to provide a unique method of producing via holes in a dielectric more uniformly and accurately than has been possible heretofore.

Another important object of this invention is to provide multi-layer circuit board structure in which well-formed, miniature via holes can be readily produced.

Another object of this invention is to provide a method of constructing via holes in a radiation-sensitive dielectric, which method can be used for successive layers.

Another object of this invention is to provide multi-layer circuit board structure which can be produced in quantity for subsequent customization of via hole location by exposure to radiant energy.

A further object of this invention is to provide a method of constructing improved via holes in either a reinforces or non-reinforced radiation-sensitive dielectric.

A still further object of this invention is to provide a method of constructing smaller holes in which the diameter is limited only by the resolution capability of a radiation-sensitive dielectric.

In the attainment of the foregoing objects, the method of the invention is to apply radiation-sensitive dielectric material to metallic, electrically conductive foil. The dielectric can be either the more common negative type, insolubilizing upon exposure to radiation, or the positive type, solubilizing upon exposure. When the negative type is used, the via hole locations are shielded, and the dielectric is exposed to radiant energy. A second foil is added to sandwich the dielectric between the two foils. One of the metal foils is etched so as to expose only the soluble dielectric portions which are thereafter removed by solvents. When the dielectric is positive, no exposure to activating radiant energy occurs until the second foil is laminated to the sandwich. After etching a metal foil at the desired locations, the foil serves as a mask to applied radiant energy which solubilizes the dielectric at the hole locations. Solvents can then remove the dielectric where exposed to produce a void to the other foil. In either case, a conductor can be placed in the void to produce the interconnection. Circuits are formed in the usual manner in the foil layers.

By using a photosensitive material as a dielectric, advantage may be taken of the excellent edge definition available with energy irradiation. This process also improves location accuracy of the holes and eliminates much of the non-uniformity of hole cross-sections. The invention exhibits a desirable versatility: it is well adapted for use with dielectrics applied either in the film or liquid form; it can be used with reinforced or non-reinforced dielectrics; and it is not limited to a narrow range of dielectric thicknesses.

The foregoing objects, features and advantages will be apparent from the following more particular description of preferred embodiments of the invention as illustrated in the accompanying drawings wherein:

FIGS. 1*a*-1*g* are sectional views of a multi-layer circuit board as it appears during the sequential steps of construction in accordance with this invention when using a negative-type dielectric;

FIGS. 2*a*-2*c* are sectional views of a circuit board constructed in accordance with a modification of the invention shown in FIGS. 1*a*-1*g;*

Figure 1A:
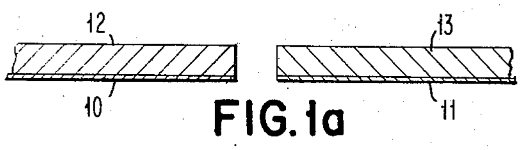
Figure 1B:
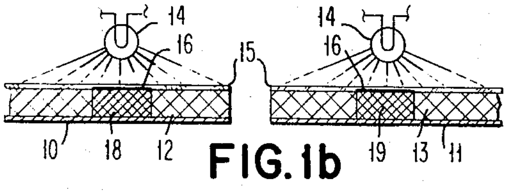
Figure 1C:
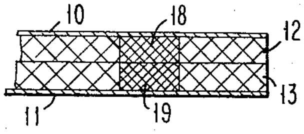
Figure 1D:
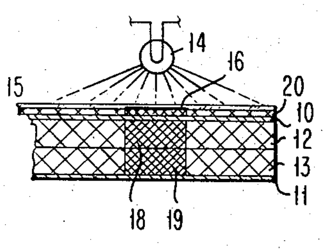
Figure 1E:
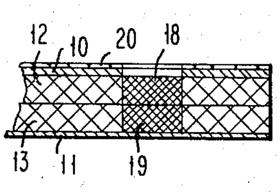
Figure 1F:
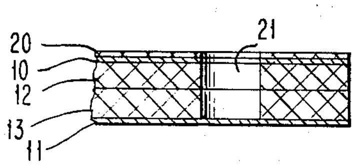
Figure 1G:
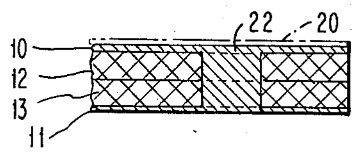
Figure 5A:
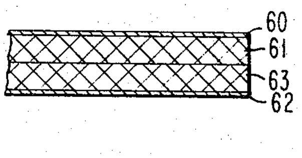
Figure 5B:
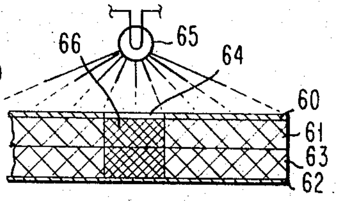
Figure 5C:
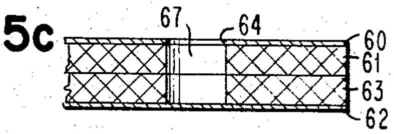
Figure 6:
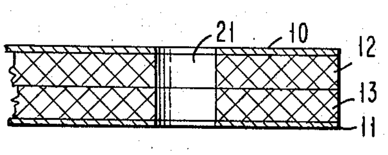

FIGS. 5*a*-5*c* are sectional views of a multi-layer circuit board as it appears during the steps of construction according to the invention when using a positive dielectric; and FIG. 6 is a sectional view of the circuit board of FIGS. 1f and 5c in which the second metal foil is also removed.

DETAILED DESCRIPTION

Referring to FIG. 1, there are shown the construction steps of a circuit board when using negative type energy sensitive dielectrics. In FIG. 1*a*, a pair of metal foil layers 10, 11 are each coated with a layer 12, 13, respectively, of photosensitive dielectric material. The metal foil may be copper while the dielectric material may be commercially available photoresists such as Riston, a film resist available from the E. I. DuPont de Nemours Company, or liquid resists, such as Roskydal UVIO from Naftone, Ince, or Dynachem UV Curing Resin from the Dynachem Corporation. Film resists are preferable for building thicker insulation layers 12, 13 since multiple plies can be adhered together readily. The photoresist is applied in the usual manner according to the supplier's recommendations. Liquid resists can usually be built up by applying subsequent coatings as the first or preceding coatings are dried.

After application of the layers 12, 13, the photosensitive material of each is exposed to appropriate radiation, usually light in the ultraviolet range, to polymerize or cross-link the material, as in FIG. 1*b*. Exposure is made by energy from source 14 through masks 15, having opaque areas 16 to protect the hole locations from the applied energy. The photosensitive material polymerizes in the exposed portions, leaving unexposed portions 18, 19 soluble for removal during subsequent development.

Masks 15 are removed after exposure, and the two composites of foil and exposed dielectrics are joined so that the two dielectric layers are adjacent each other with the non-polymerized portions 18, 19 aligned as in FIG. 1*c*. The construction of the individual composites in FIGS. 1*a* and 1*b* is preferably done by forming registration holes prior to exposure so that alignment of the unexposed portions can be held to close tolerances. Exposed layers 12, 13 are adhered to each other through natural tackiness remaining after exposrue, aided by heat and pressure. Polymerization of unexposed resist is generally a direct function of temperature and time. Therefore, lamination should be done within specified limits to avoid cross-linking portions 18, 19 in FIG. 1*c*. Riston, for example, can be suitably laminated after exposure by subjecting it to a temperature of 120° C for a period of 10 minutes under a pressure of 5 psi. Also in the case of Riston, the polyester protective cover sheet is removed from each layer prior to this laminating step.

When the unitary structure is formed by the lamination step, one of the metal foil layers is processed to form a hole therein in alignment with the unexposed dielectric portions 18, 19 as in FIG. 1*d*. This step is done in the conventional manner of applying a photoresist 20, exposing the resist through mask 15 to radiation source 14, developing the resist to uncover the desired metal area under the opaque mask area, and subjecting the metal to an etchant. It will be noted that the foil-dielectric assembly with photoresist can be exposed with the same mask and registration pins used for the previous exposures of the negative dielectric.

The result of metal foil etching is shown in FIG. 1e wherein the metal of layer 10 directly above unexposed dielectric 18, 19 is removed. Dielectric portions 18, 19 are now developed by the usual process and solvents required for the soluble photosensitive dielectric are used. This removes portions 18, 19 along the exposure boundary so that bottom foil layer 11 is uncovered. Since the dielectric was polymerized along straight, vertical lines during exposure, the resulting hole 21 is cylindrical and of uniform cross-section. This is in contrast to the usual irregular hole configuration formed by etching or the rough-sided holes formed by drilling.

A via connection can be made between conductive foil layers 10 and 11 by known procedures. For example, a pin 22 can be formed by electroplating or by filling the hole with a conductive, hardenable paste or preformed slug. Thereafter, exposed photoresist layer 20 is removed leaving the two selectively coupled copper layers 10 and 11 clear for subsequent formation of circuit lines. Circuit lines can be formed through the usual subtractive process of selective etching.

Figure 2A:
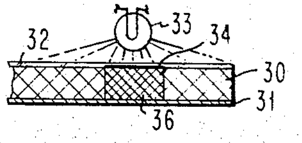
Figure 2B:
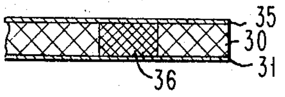
Figure 2C:
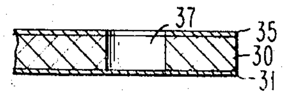

The foregoing process for constructing via holes can be modified in various ways. One such modification is to attach the photosensitive dielectric to one metal foil only, expose, and then apply the second foil. Referring to FIGS. 2*a*-2*c*, a photosensitive dielectric layer 30 is applied to a metal foil 31 and exposed under a mask 32 with activating radiation from source 33. Dielectric 30 is polymerized or insolubilized, of course, under the transparent portion of the mask and remains soluble in the portion 36 under opaque area 34. After irradiation, mask 32 is removed and a second metal foil layer 35 is laminated to exposed dielecric 30 as the top conductive layer. This is shown in FIG. 2*b*. Thereafter, metal foil 35 can be covered with resist and selectively etched away in alignment with unexposed dielectric portion 36 as described with relation to FIG. 1e. After the foil is etched, the soluble dielectric can be removed leaving hole 37 extending to the surface of foil 31. A connecting conductor can then be added between the two foil layers.

The modification just described is not preferred because photosensitive dielectrics do not exhibit the best adhesive characteristic after exposure. Because of this, the process of FIGS. 2*a* through 2*c* may require higher heat and pressure or the selective application of an adhesive upon lamination of the second foil 35. These dielectrics do, however, exhibit a satisfactory cohesiveness when laminated to like materials after exposure.

Figure 3:
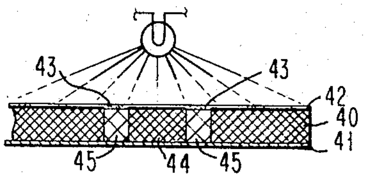
FIG. 3 is a sectional view of a multi-layer circuit board constructed according to FIGS. 1*a*-1*g* in which the pattern of the exposed dielectric has been modified.

In order to take advantage of the greater cohesion of unexposed photosensitive dielectric, those areas originally polymerized may, instead, be modified in accordance with that shown in FIG. 3. Here, photosensitive dielectric 40 is applied to foil layer 41 in the usual, unexposed manner. Thereafter, mask 42 is positioned over dielectric 40 for exposure. However, mask 42 differs from those described above in that the major portion of the mask is rendered opaque leaving only a small annular transparent area 43 surrounding the ultimate location of a hole 44. With such a mask, most of the upper surface of dielectric 40 is left unexposed so that it has better adhering qualities when joined either with a second layer of dielectric or metal foil. The small annular polymerized portion 45 serves to define the hole configuration in the dielectric.

Figure 4:
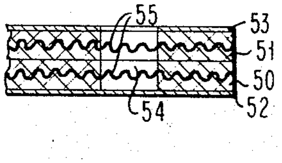
FIG. 4 is a sectional view of a circuit board constructed according to the invention in which reinforcing material is added to the dielectric.

In some instances, it is desirable that the dielectric between conductive layers be reinforced with fibrous material, generally glass fibers. FIG. 4 illustrates that such fibrous material can be embedded in the unexposed photosensitive dielectric, and the dielectric and foil processed in the usual manner. Here, dielectric layers 50, 51 have been applied to their respective metal foils 52, 53 and exposed and laminated to each other. Foil 53 has been etched away, and hole 54 formed in the dielectric. At this stage, the fibers 55 remain intact in the hole. These can be removed by the application of a suitable solvent; if the fibers are glass, then hydrofluoric acid can be used. It may be desirable in some instances, depending upon the density of fibers, to leave the fibers in place and electroplate through them from lower foil layer 52.

FIGS. 5*a*-5*c* illustrate the via hole forming process of the invention when a positive dielectric is used. Since this dielectric becomes soluble when exposed to radiant energy, both composites of foil and resist 60, 61 and 62, 63 can be joined as an assembly immediately after applying the dielectric layer to each of the foil layers. After joining, one of the foil layers 60 is etched away at the via hole location 64 in FIG. 5*b*. The etched foil layer serves as a mask to admit energy from source 65 to solubilize portion 66 of the exposed dielectric. Subsequent development of the dielectric then removes the soluble portion to leave hole 67, FIG. 5*c*, exposing the top surface of foil layer 62, similar to FIG. 1*f*. An interconnecting conductor can now be formed in the hole. A suitable positive dielectric is Shipley AZ119, available from the Shipley Company, Inc.

As described with respect to FIG. 4, reinforcing strands can also be used with the positive dielectrics. This can be easily done by dipping a reinforcing material, usually a web, in the dielectric when in a liquid state and then applying the saturated web to the metal foil. As with the negative dielectric, a solvent can be used to remove strands of reinforcement from the via hole.

FIG. 6 illustrates a modification of the process in which metal foil layer 11 of FIG. 1f can be also removed in alignment with hole 21 so that plated-throughholes can be formed if desired. Foil layer 11, of course, can be etched away concurrently with layer 10 at the top of the assembly to save processing time. When the conductive layers are both removed, holes having a higher aspect ratio of depth to diameter can be formed.

When the metal foil is used in the invention, such as half-ounce copper, the composite of foil and dielectric becomes difficult to handle because of low structural strength. This problem is alleviated by mounting the foil on a temporary backer board. Such a board might be a stainless steel sheet, 0.060 inch in thickness to which the foil is secured by an easily soluble adhesive. After the two foil composites are assembled, one or both of the backer boards can be removed and the processing continued. Examples of adhesives are wafer-soluble polyvinyl alcohol in solution or sheet form or Riston applied to the backer board with the protective film left in place and a second Riston sheet applied to the foil with its protective film removed and the uncovered Riston applied to the first protective film on the backer element.

As will be evident from the foregoing description, the processes, with both the negative and positive dielectrics, can be used in slightly modified form to add successive conductive layers. If two layers of dielectric are joined, one, of course, will be placed on a conductive layer having circuit lines formed, and the dielectric layer will be attached over most of its surface to other dielectric already exposed by removal of the foil. The third foil layer and its attached dielectric will be added in the normal manner. When a single layer of dielectric is used to add the third conductive layer, it can be initially secured to the original multi-layer package or to the new third layer. Subsequent to removal of the soluble portions of dielectric, the remainder can be further cured or cross-linked with heat.

While the invention has been particularly shown and described with reference to preferred embodiments thereof, it will be understood by those skilled in the art that the foregoing and other changes in form and details may be made therein without departing from the spirit and scope of the invention.

What is claimed is:

1. A method of forming an electrical connection between two conductive layers separated by insulative material comprising the steps of:

securing a layer of electrically insulative material to each of two layers of electrically conductive material to form a pair of composites, said insulative material having the characteristic of exhibiting a change in solubility when subjected to incident radiant energy;

selectively irradiating said insulative layers with said energy to produce relatively soluble and insoluble portions therein;

uniting said composites into a unitary assembly with said insulative layers adjacent each other and portions of like solubility in alignment while preserving solubility differences;

exposing the soluble portion of one of the insulative layers by etching away the portion of one of the conductive layers overlying said soluble portion;

removing said exposed soluble portion and the soluble portion aligned therewith by application of a solvent to expose a portion of said other conductive layer; and forming a conductor in the void produced by removal of said conductive and soluble portions to electrically connect said conductive layers.

2. The method according to claim 1 wherein each said insulative layer is a film secured to a said conductive layer.

3. The method according to claim 1 wherein at least one said insulative layer includes reinforcing strands embedded therein.

4. The method according to claim 1 wherein:

during said irradiating step said insulative members are each shielded so as to produce at least one relatively insoluble toroid of material both surrounded by and surrounding soluble portions of material;

said composites are united so that said surrounded portions of soluble material are aligned; and the removed portion of one of said conductive layers exposes said surrounded soluble portion of insulative material.

5. A method of forming an electrical connection between two conductive layers separated by insulative material comprising the steps of:

securing each of a pair of layers of electrically insulative material to a respective one of a pair of layers of electrically conductive material, said insulative material having the characteristic of exhibiting a change in solubility when subjected to incident radiant energy;

securing said two layers of insulating material together with said respective conductive layers opposite the joined surfaces of said insulative layers while preserving solubility characteristics;

selectively exposing an underlying portion of one of said insulative layers by etching away the portion of the conductive layer adjacent thereto;

irradiating said exposed insulative material to produce solubility thereof in both said insulative layers;

removing said solubilized insulative material by application of a solvent thereto to produce a void exposing the other of said conductive layers; and forming a conductor in said void produced by removal of said conductive and soluble portions to electrically connect said conductive layers.

* * * * *